(12) United States Patent
Boemler

(10) Patent No.: US 10,855,281 B2
(45) Date of Patent: Dec. 1, 2020

(54) WIDE SUPPLY RANGE DIGITAL LEVEL SHIFTER CELL

(71) Applicant: Raytheon Company, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/541,546

(22) Filed: Aug. 15, 2019

(65) Prior Publication Data

US 2020/0112311 A1    Apr. 9, 2020

Related U.S. Application Data

(60) Provisional application No. 62/741,121, filed on Oct. 4, 2018.

(51) Int. Cl.
*H03K 19/0185*    (2006.01)
*H03K 19/00*    (2006.01)
*H03K 19/0175*    (2006.01)

(52) U.S. Cl.
CPC . *H03K 19/018514* (2013.01); *H03K 19/0002* (2013.01); *H03K 19/017545* (2013.01)

(58) Field of Classification Search
CPC ....... H01L 2924/00; H01L 2924/00014; H01L 2924/48247; H01L 2924/49111; H01L 2924/48091; H03K 19/018514; H03K 19/0002; H03K 19/017545; H03K 3/356113; H03K 3/013
See application file for complete search history.

(56) References Cited

U.S. PATENT DOCUMENTS

| 9,438,211 | B1* | 9/2016 | Chong ............. H03K 3/356104 |
| 2005/0134311 | A1 | 6/2005 | Lin | |
| 2008/0224755 | A1* | 9/2008 | Jo ............................ G09G 3/20 327/333 |
| 2017/0170572 | A1 | 6/2017 | Severson et al. | |
| 2018/0061495 | A1 | 3/2018 | Conte et al. | |

FOREIGN PATENT DOCUMENTS

JP    2006237760 A    9/2006

OTHER PUBLICATIONS

International Search Report and Written Opinion for Application No. PCT/US2019/050525; Application Filing Date Sep. 11, 2019; dated Nov. 6, 2019 (20 pages).

* cited by examiner

*Primary Examiner* — Sibin Chen
(74) *Attorney, Agent, or Firm* — Cantor Colburn LLP

(57) ABSTRACT

A wide supply range digital level shifter circuit shifts between a variable desired output voltage ranging from a first voltage level and a second voltage level. The wide supply range digital level shifter circuit includes a latch circuit, a first bleeder circuit, and a second bleeder circuit. The latch circuit receives the first voltage level and the second voltage level, and includes first and second clocked differential switches. The first bleeder circuit is connected between the second voltage rail and the first differential switch and is configured to receive a first digital input voltage. The second bleeder circuit is connected between the second voltage rail and the second differential switch and is configured to receive a second digital input voltage. The first and second bleeder circuits isolate the first and second digital input voltages from the variable desired output voltage.

19 Claims, 3 Drawing Sheets

WIDE SUPPLY RANGE DIGITAL LEVEL SHIFTER CELL

This application claims priority to U.S. Provisional Application Ser. No. 62/741,121 filed Oct. 4, 2018, the contents of which are incorporated by reference herein in its entirety.

BACKGROUND

The present invention relates to digital electronic logic circuits, and more specifically, to digital level shifter circuits.

Integrated circuits (ICs) typically utilize digital level shifter circuits to translate logic voltage levels between different voltage domains. It is common to translate from a low voltage standard cell supply (e.g. 0V to 1.8V) to a higher voltage analog supply (e.g. 0V to 3.3V) to control the behavior of analog signals, along with facilitating analog clocking schemes. Conventional digital level shifter circuits are capable of shifting between positive voltage levels. For instance, a typical level shifter can shift between a first positive voltage range (e.g. low=0V, high=1.8V) and a second positive voltage range (e.g., low=0V, high=3.3V). Further, most known digital level shifter circuits are capable of only translating (i.e., shifting) the high voltage level, and can only shift the voltage level between very specific positive voltage levels.

SUMMARY

According to a non-limiting embodiment, a wide supply range digital level shifter circuit shifts between a variable desired output voltage ranging from a first voltage level and a second voltage level. The wide supply range digital level shifter circuit includes a latch circuit, a first bleeder circuit, and a second bleeder circuit. The latch circuit receives the first voltage level and the second voltage level, and includes first and second clocked differential switches. The first bleeder circuit is connected between the second voltage rail and the first differential switch and is configured to receive a first digital input voltage. The second bleeder circuit is connected between the second voltage rail and the second differential switch and is configured to receive a second digital input voltage. The first and second bleeder circuits isolate the first and second digital input voltages from the variable desired output voltage.

According to another non-limiting embodiment, a method is provided to control a wide supply range digital level shifter circuit configured to shift between a variable desired output voltage ranging from a first voltage level set by a first voltage rail and a second voltage level set by a second voltage rail. The method comprises connecting a latch circuit between the first voltage rail and the second voltage rail. The latch circuit includes first and second clocked differential switches, a first pair of cross-coupled switches, and a second pair of cross-coupled switches. The method further comprises connecting a first bleeder circuit between the second voltage rail and the first differential switch. The method further comprises connecting a second bleeder circuit between the second voltage rail and the second differential switch. The method further comprises isolating the first and second digital input voltages from the variable desired output voltage via the first and second bleeder circuits.

According to another non-limiting embodiment, a wide supply range digital level shifter circuit is provided which is configured to shift between a variable desired output voltage ranging from a first voltage level set by a first voltage rail and a second voltage level set by a second voltage rail. The wide supply range digital level shifter circuit comprises a latch circuit connected between the first voltage rail and the second voltage rail. The latch circuit includes first and second clocked differential switches and a back-to-back inverter memory cell. A first bleeder circuit is connected between the second voltage rail and the first differential switch and configured to receive a first digital input voltage. A second bleeder circuit is connected between the second voltage rail and the second differential switch and configured to receive a second digital input voltage.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Disclosed herein are embodiments of a high voltage high current (HVHC) transformer. One or more of these embodiments can have the effect of keeping inductive losses lower while still keeping sufficient distances between windings to avoid breakdowns between the winding. The embodiments herein are based on a general construct that includes a core having two core legs with multiple primary and secondary windings disposed around both legs.

Digital circuits, including digital level shifter circuits, typically employ a common ground supply shared among both the digital components and the analog components. This common ground supply imposes strict limitations as to what voltage levels can be applied to the circuit as a whole. Consequently, known digital level shifter circuits are incapable of shifting voltage levels from a low voltage level to negative voltage level. Therefore, the limitation of known digital level shifter circuit can restrict various IC designs aiming to shift to negative voltage levels.

Various non-limiting embodiments described herein provide a wide supply range digital level shifter circuit that includes an alternating current-coupled (AC-coupled) latch that serves as an isolation between the low voltage logic from the desired output voltage levels. The wide supply range digital level shifter circuit has two logical states, i.e., two logic level control signals: "Set" and "Clear". The wide supply range digital level shifter circuit employs an AC bleeder circuit that controls the energy storage across a capacitor, which operate together to hold the voltage below a selected voltage threshold thereby allowing the latch to shift to a negative state.

Figure 1:
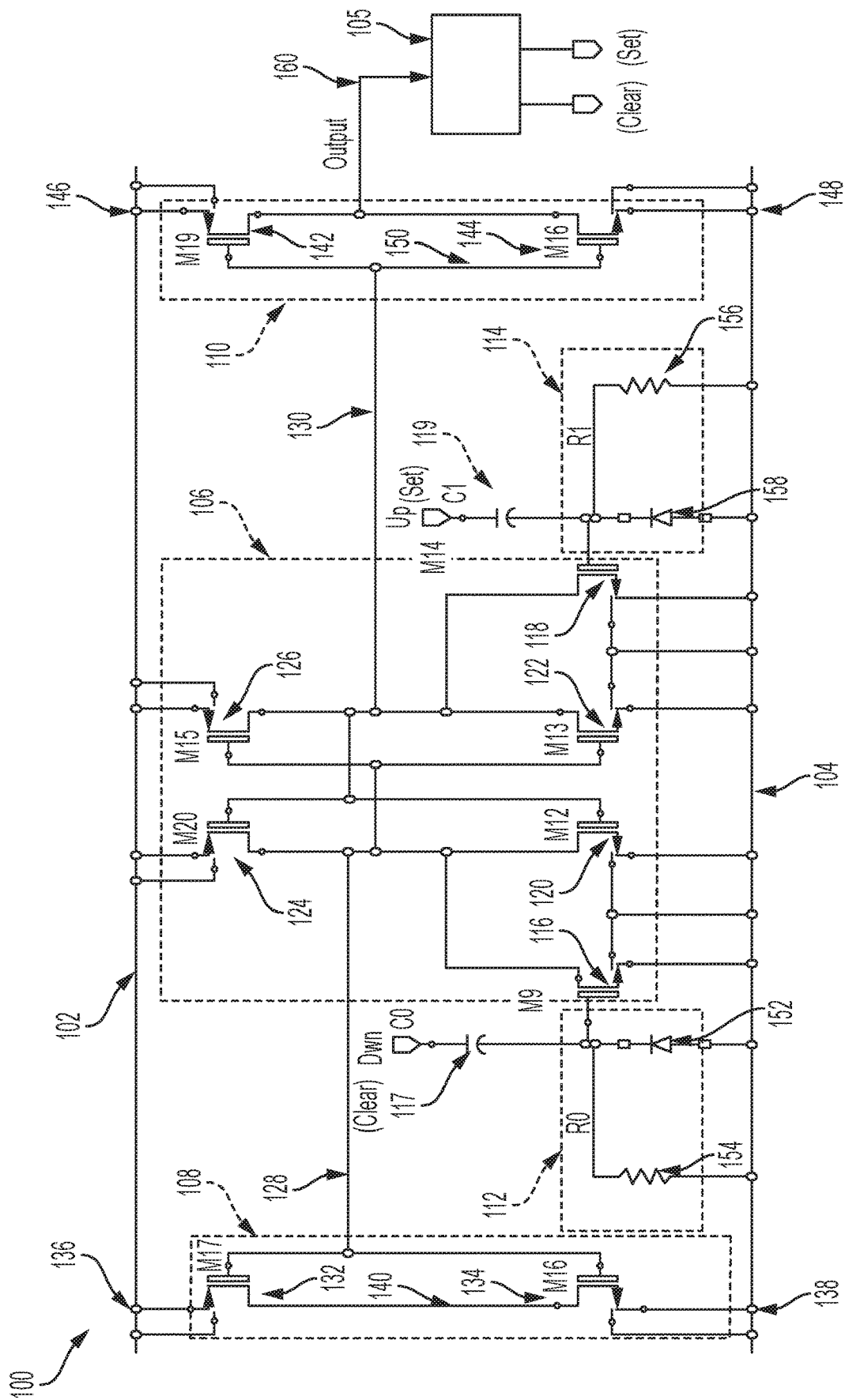
FIG. 1 is a schematic diagram of a wide supply range digital level shifter circuit according to a non-limiting embodiment.

With reference to FIG. 1, a wide supply range digital level shifter circuit 100 configured to shift an output between a first voltage rail 102 (e.g., a positive voltage rail 102) and a second voltage rail 104 (e.g., a negative voltage rail 104), is illustrated according to a non-limiting embodiment. The voltages selected for the first and second voltage rails 102 and 104 set the range of the desired variable output voltage 160 provided by the wide supply range digital level shifter circuit 100. In at least one non-limiting embodiment, the positive voltage rail 102 ranges, for example, from about 0 volts (V) to about 3.5 V, while the negative voltage rail 104 ranges from about 0 V to about −3.5 V. The wide supply range digital level shifter circuit 100 (hereinafter referred to as the level shifter 100) includes a latch circuit 106, a first load balancing circuit 108, a second load balancing circuit 110, a first bleeder circuit 112, and a second bleeder circuit 114. The latch circuit 106 can be constructed as a strong ARM latch 106, for example, which is encapsulated in a deep N-well semiconductor substrate to achieve the negative voltage range. The deep N-well can electrically isolate the level shifter 100 from the P-substrate region of the substrate. Accordingly, the P-substrate region can be set lower than ground to provide the negative voltage range source.

The latch circuit 106 includes first and second clocked differential switches (M9) 116 and (M14) 118, a first pair of cross-coupled switches (M12) 120 and (M13) 122, and a second pair of cross-coupled switches (M20) 124 and (M15) 126. The first pair of cross-coupled switches 120/122 and second pair of cross-coupled switches 124/126 operate together as a back-to-back inverter memory cell. In at least one embodiment, the differential switches (M9) 116 and (M14) 118 are sized larger than both the first pair of cross-coupled switches (M12) 120 and (M13) 122 and the second pair of cross-coupled switches (M20) 124 and (M15) 126 in order to pull-down a respective side of the latch circuit 106 to set the value of the inverter memory cell. For example, the differential switches (M9) 116 and (M14) 118 can have a lower impedance compared to both the first pair of cross-coupled switches (M12) 120 and (M13) 122 and the second pair of cross-coupled switches (M20) 124 and (M15) 126. In this manner, the differential switches (M9) 116 and (M14) 118 are viewed as stronger than both the first pair of cross-coupled switches (M12) 120 and (M13) 122 and the second pair of cross-coupled switches (M20) 124.

The latch circuit 106 further includes a first center-tap voltage terminal 128 and a second center-tap voltage terminal 130. A first end of the first center-tap voltage terminal 128 is connected in common with a first cross-coupled switch 120 among the first pair of cross-coupled switches 120/122 and a first cross-coupled switch 124 among the second pair of cross-coupled switched 124/126. An opposing second end of the first center-tap voltage terminal 128 is connected to the first load balancing circuit 108. Similarly, a first end of the second center-tap voltage terminal 130 is connected in common with a second cross-coupled switch 120 among the first pair of cross-coupled switches 120/122 and a second cross-coupled switch 126 among the second pair of cross-coupled switched 124/126. The opposing second end of the second center-tap voltage terminal 130 is connected to the second load balancing circuit 110.

The first load balancing circuit 108 includes a first balancing switch 132 and a second balancing switch 134. The first balancing switch 132 has a first switch terminal 136 connected to the first voltage rail 102. The second balancing switch 134 has a second switch terminal 138 connected to the second voltage rail 104. A common terminal 140 connects the first balancing switch 132 together with the second balancing switch 134.

The second load balancing circuit 110 includes a third balancing switch 142 and a fourth balancing switch 144. The third balancing switch 142 has a first switch terminal 146 connected to the first voltage rail 102. The fourth balancing switch 144 has a second switch terminal 148 connected to the second voltage rail 104. A common terminal 150 connects the third balancing switch 142 together with the fourth balancing switch 144.

The first bleeder circuit 112 is connected between the second voltage rail 104 and the first differential switch 116 (M9). The first bleeder circuit 112 is configured to receive a first input voltage (Clear), which is delivered via a first AC-coupling element 117 and controls the operation of the wide supply range digital level shifter circuit 100 as described in greater detail below.

In at least one embodiment, the first AC-coupling element 117 is a capacitor. The first bleeder circuit 112 includes a first diode 152 connected in parallel with a first resistor 154. The first diode 152 has an anode connected directly to the second voltage rail 104 and a cathode connected directly an input of the first differential switch 116 (M9) and the first capacitor 117. The first resistor 154 has a first terminal connected directly to the second voltage rail 104 and an opposing second terminal connected directly to the cathode of the first diode 152, the input of the first differential switch 116 (M9) and the first capacitor 117.

The second bleeder circuit 114 is connected between the second voltage rail 104 and the second differential switch 118 (M14). The second bleeder circuit 118 is configured to receive a second input voltage (Set), which is delivered via a second AC-coupling element 119 and controls the operation of the wide supply range digital level shifter circuit 100 as described in greater detail below. In at least one embodiment, the second AC-coupling element 119 is a capacitor. The second bleeder circuit 114 includes a second diode 156 connected in parallel with a second resistor 158. The second diode 156 has an anode connected directly to the second voltage rail 104 and a cathode connected directly an input of the second differential switch 118 (M14) to receive the second voltage input (Set) from the second capacitor 119. The second resistor 158 has a first terminal connected directly to the second voltage rail 104 and an opposing second terminal connected directly to the cathode of the second diode 156 and the input of the second differential switch 118 M14 to receive the second voltage input voltage (Set).

In at least one embodiment, the first capacitor 117 and the second capacitor 119 are constructed as metal-insulator-metal (MIM) capacitors, which deliver the first input signal (Clear) and the second input signal (Set) to the first and second bleeder circuits 112 and 114, respectively. The combination of the capacitor and respective bleeder circuit allows for AC-coupling the latch circuit 106 by ensuring that the difference in voltage between the fixed logic level of the digital input signal (e.g., Clear signal or Set signal) and the variable low voltage level of the level shifter output 160 remains across the first and second capacitors 117 and 119, respectively. That is, the first and second capacitors 117 and 119 operate together with the first and second bleeder circuits 112 and 114 to effectively isolate the input logic levels of the digital input signals (e.g., the Clear Signal and the Set Signal) and the desired high/low voltage levels of the output signal 160. In at least one embodiment, the first and second capacitors 117 and 119 can be rated at voltages far in excess of 6 V, which allows for a voltage difference between the digital logic supply (e.g. less than 1.8 V) and a low voltage level (e.g. −3.3 V) of the level shifter output 160.

During the low state of the digital input signal (e.g., Clear signal or Set signal=0 V), the first and second bleeder circuits 112 and 114 will "bleed off" any voltage present at the respective common node of the first and second resistors 154 and 156, cathode and input of the first and second differential switches 116 and 118. When the digital input signal (e.g., the Clear signal) applies a high voltage pulse (e.g., 5V for about 25 nanoseconds (ns)), the first differential switch 116 is switched on. Accordingly, when the second digital input signal (e.g., the Set signal) applies a 5V pulse, the second differential switch 118 is switched on, and the back-to-back invertor memory cell provided by latch circuit 106 is pulled-down (i.e., activated) to store the state of the current output 160. When the first digital input signal (e.g., the Clear signal) applies a 5V pulse, the first differential switch 116 is switched on and the latch circuit 106 is flipped, thereby clearing the previously stored value from the back-to-back invertor memory cell.

The level shifter 100 operates in conjunction with a controller 105, which generates the first input voltage signal (Clear) and the second input voltage signal (Set), while monitoring the level shifter output 160. The first and second input signals (Clear and Set) are digital voltage signals, which are applied to the first and second capacitors 117 and 119 connected to the inputs of the first and second bleeder circuits 112 and 114. The first and second input signals (Clear and Set) remain at a low voltage (e.g., 0 V) for a set time period (e.g., greater than 5,000 ns) until the level shifter 100 changes state. When the level shifter 100 changes state, the first and second input signals (Clear and Set) are set as high voltages (e.g., 5V) for a very short time (e.g., about 25 ns).

The second input signal (Set) at high voltage (e.g., 5V) applied to the second capacitor 119 switches on the second differential switch 118, which pulls the latch 106 to a high state. The first input signal (Clear) at high voltage (e.g., 5V) applied to the first capacitor 117 switches on the first differential switch 116, which pulls the latch 106 to a low stage. When neither first input signal (Clear) nor the second input signal (Set) is at a high voltage, the latch 106 will maintain the current state. Accordingly, the latch 106 can operate as memory cell that stores the current state of the latch 106.

In response to the state change, the controller 105 determines a voltage differential between an intended level shifter output value and the current output value present at the level shifter output 160. Based on the voltage differential, the controller 105 briefly sets either the first voltage signal (e.g., the "Clear" signal) or the second voltage signal (e.g., the "Set" signal) when the level shifter 100 switches to low or high output voltage levels, respectively.

When the first and second input signals (e.g., Clear and Set) are set to low, the first and second resistors 154 and 156 cause the internal control voltage to drift toward the low level-shifter low output level. When the controller 105 determines that the level shifter 100 needs to change state, either the first input signal (Clear) or the second input signal (Set) are set to high voltage. The first input signal (Clear) or the second input signal (Set) rises quickly such that voltage propagates through the first and second capacitors 117 and 119, respectively, thereby causing a rise in the respective internal control voltage applied to the respective bleeder circuit 112 and 114, respectively. The rise in voltage turns on the respective differential switch 116 and 118, which in turns operates the latch circuit 106, e.g., switch the storage states of the memory cell defined by the latch circuit 106. Accordingly, the input control of the latch circuit 106 can operate independently from the voltage levels present at the first and second voltage rails 102 and 104. In this manner, the low and high voltage levels of the level shifter 100 is AC-coupled via the first and second capacitors 117 and 119, while also having the capability to provide a large range in selection of low versus high output levels.

When the first and second input signals (e.g., Clear and Set) are set to low again, the respective diffusion diode 152 and 156 prevents the internal control voltage from transitioning below the low output level voltage. This turns off the respective input transistor 116 and 118 and the circuit utilizes the back-to-back inverter memory cell 106 to store the output level state. The amount of charge injected into the floating substrate is only how much the bleeder resistor drained the respective capacitor 117 and 119 during the short high period and the respective diode 152 and 156 is guard-ringed to prevent latchup or a permeant erroneous logic flip.

As described above, the level shifter 100 includes a latch circuit 106 configured to output a static low-level or static high-level output 160. Radiation or electromagnetic noise, however, can produce single event upsets (SEUs), which can unintentionally cause the latch circuit 106 to flip states. To minimize the effects SEUs from permanently toggling the level shifter 100, at least one embodiment of the level shifter 100 employs a refresh control scheme that periodically forces the latch circuit 106 to the known current voltage state of the latch output 160.

Figure 2:
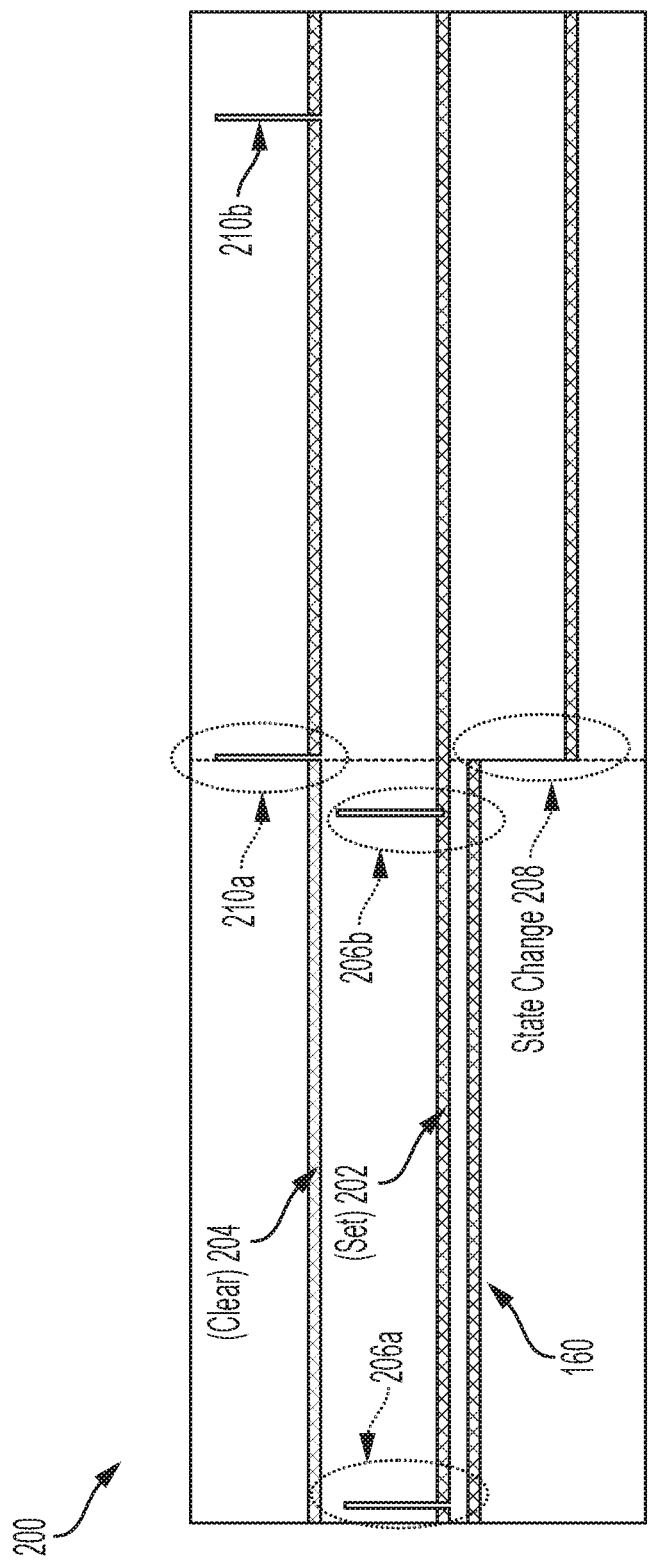
FIG. 2 is a signal diagram illustrating operation of the wide supply range digital level shifter circuit shown in FIG. 1 according to a non-limiting embodiment.

Turning to FIG. 2, for example, a signal diagram 200 illustrates a digital "Set" input signal 202, a digital "Clear" input signal 204, and the level shifter output signal 160. In this example, the controller 105 outputs a first digital "Set" input pulse 206a, which forces the latch circuit 106 to store the current "high value" of the output signal 160. While the output signal 160 remains at a "high value", the controller 105 outputs a subsequent digital "Set" input pulse 206b. The subsequent digital "Set" input pulse 206b ensures that latch circuit 106 memory cell is refreshed to the current state of the output signal 160. By continuously outputting subsequent "Set" input pulse 206b . . . 206n, the latch circuit 106 can be continuously refreshed to the "high state" should it be inadvertently switched to a "low state" due to an intervening SEU. Although only one subsequent "Set" input pulse 206b is illustrated, it should be appreciated that the subsequent "Set" input pulse 206b can be continuously output over a predetermined time period (e.g., about every 5 microseconds (µs))

The signal diagram 200 also shows a state change 208, where the output signal 160 transitions from a "high state" to a "low state." Similarly, the controller 105 determines the "low state" of the output signal 160, and outputs a first digital "Clear" input pulse 210a, which clears the "high value" from the latch circuit 106. While the output signal 160 remains at a "low value", the controller 105 outputs a subsequent digital "Clear" input pulse 210b. The subsequent digital "Clear" input pulse 2010b ensures that latch circuit 106 memory cell is continuously refreshed to "low value" of the output signal 160. By continuously outputting subsequent "Clear" input pulses 210b . . . 210n, the latch circuit 106 can be refreshed to the "low state" should it be inadvertently switched to a "high state" due to an intervening SEU. Although only one subsequent "Clear" input pulse 210b is illustrated, it should be appreciated that the subsequent "Clear" input pulse 210b can be continuously output over a predetermined time period (e.g., about every 5 µs)

Figure 3:
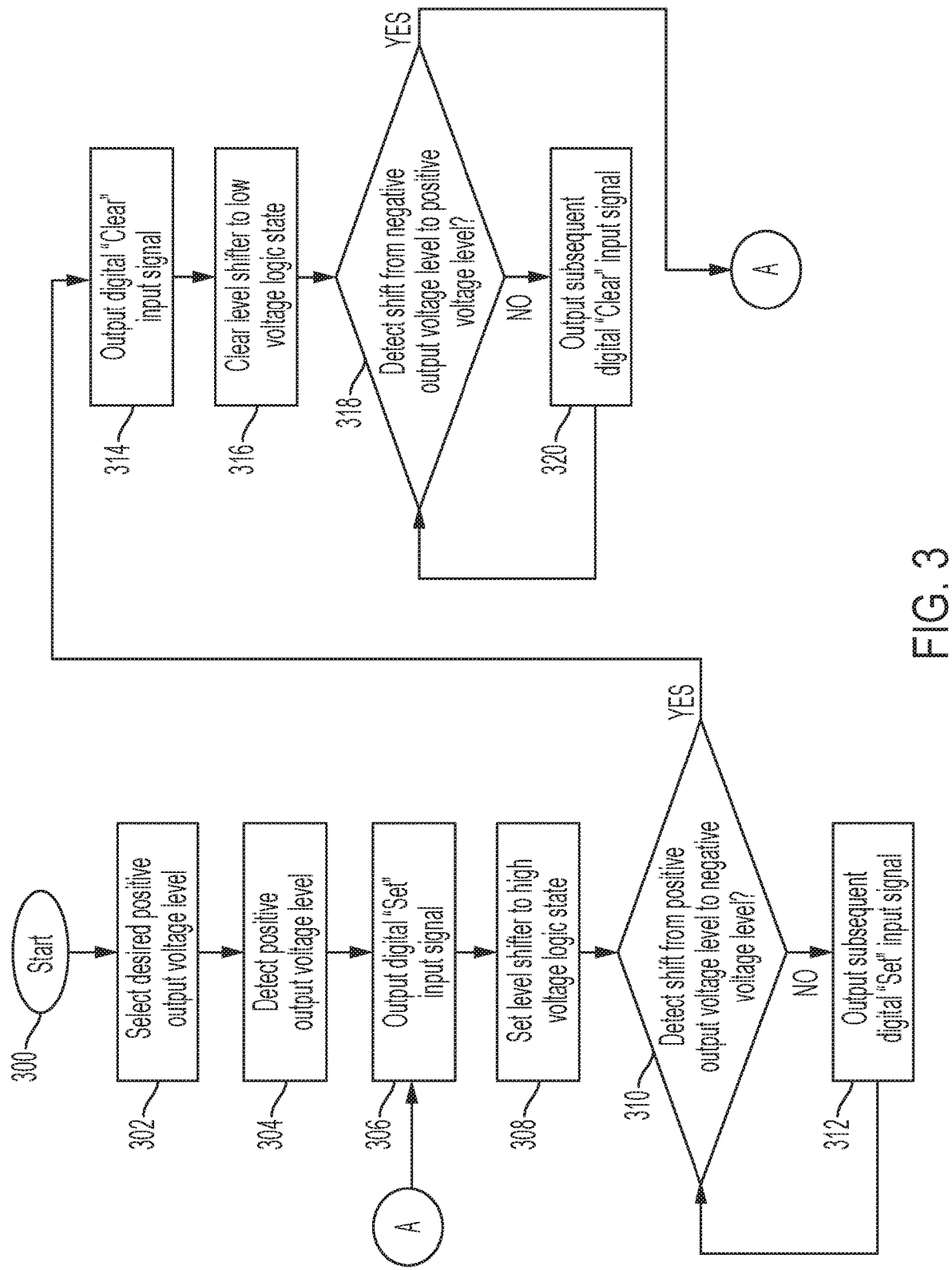
FIG. 3 is a flow diagram illustrating a method of shifting a wide supply range digital level shifter circuit to negative voltage levels according to a non-limiting embodiment.

With reference now to FIG. 3, a method of controlling a wide supply range digital level shifter circuit 100 (shown in FIG. 1) is illustrated according to a non-limiting embodiment. The method begins at operation 300, and at operation 302 a desired voltage level is selected. In this example, the initial desired voltage is selected as a positive voltage level, but the method is not limited thereto. At operation 304, the positive output voltage of the level shifter is detected by a controller 105 (shown in FIG. 1), and at operation 306 the controller 105 varies the voltage state of a digital logic input signal, referred to herein as a digital "Set" input signal. The varied state includes, for example, briefly increasing the voltage (e.g., pulsing) the digital "Set" input signal, such as shown by pulse 206a in FIG. 2. At operation 308, a latch circuit 106 (shown in FIG. 1) included in the level shifter 100 is set to a high voltage state in response to receiving the digital "Set" input signal as described above. At operation 310, a determination is made as to whether the output of the level shifter 100 has shifted from the current positive voltage level to a negative voltage level, which shift may be detected by the controller 105. During the time that no voltage shift has occurred (NO at operation 310), the controller 105 outputs one or more subsequent digital "Set" input signals, using one or more pulses 206b of FIG. 2, at operation 312, which refreshes the positive state of the level shifter 100.

When a voltage shift occurs (YES at operation 310), such as shown by state change 208 of FIG. 2, the controller 105 varies the voltage state of another digital logic input signal, referred to herein as a digital "Clear" input signal at operation 314. The varied state includes, for example, briefly increasing the voltage (e.g., pulsing) the digital "Clear" input signal, such as shown by pulse 210a in FIG. 2. At operation 316 the latch circuit 106 included in the level shifter 100 is set to a low voltage state (e.g., 0V) in response to receiving the digital "Set" input signal, which effectively clears the previous state from the latch circuit 106 as described above. At operation 318, a determination is made as to whether the output of the level shifter has shifted from the current negative voltage level to a positive voltage level, which shift may be detected by the controller 105. During the time that no voltage shift has occurred (NO at operation 318), the controller 105 outputs one or more subsequent digital "Clear" input signals, using one or more pulses 210b of FIG. 2, at operation 320, which refreshes the clear state of the level shifter 100. When a voltage shift occurs (YES at operation 310), however, the controller 105 again generates the digital "Set" input signal at operation at operation 306, and the level shifter 100 is again set to the high voltage logic state at operation 308. Accordingly, the level shifter 100 continues operating as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts and equivalents of all means or step plus function elements in the claims below are intended to include any structure, material or act for performing the function in combination with other claimed elements as claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While embodiments have been described, it will be understood that those skilled in the art, both now and in the future, may make various improvements and enhancements which fall within the scope of the claims which follow. These claims should be construed to maintain the proper protection for the invention first described.

What is claimed is:

1. A wide supply range digital level shifter circuit configured to shift between a variable desired output voltage ranging from a first voltage level set by a first voltage rail and a second voltage level set by a second voltage rail, the wide supply range digital level shifter circuit comprising:
   a latch circuit connected between the first voltage rail and the second voltage rail, the latch circuit including first and second clocked differential switches;
   a first bleeder circuit connected between the second voltage rail and the first clocked differential switch and configured to receive a first digital input voltage; and
   a second bleeder circuit connected between the second voltage rail and the second differential switch and configured to receive a second digital input voltage,
   wherein the first and second bleeder circuits isolate the first and second digital input voltages from the variable desired output voltage.

2. The circuit of claim 1, further comprising:
   a first capacitor connected between the first bleeder circuit and a first input that receives the first digital input voltage; and
   a second capacitor connected between the second bleeder circuit and a second input that receives the second digital input voltage.

3. The circuit of claim 1, further comprising an electronic controller configured to receive the variable desired output voltage, and to control a voltage state of the first and second digital input voltages based on a current voltage state of the variable desired output voltage.

4. The circuit of claim 3, wherein the controller outputs the second digital input voltage as a digital input pulse in response to determining the variable desired output voltage is a first voltage level, and outputs the first digital input voltage as a digital input pulse in response to determining the variable desired output voltage is a second voltage level different from the first voltage level.

5. The circuit of claim 4, wherein the controller outputs a series of digital input pulses corresponding to the second digital input voltage until detecting a shift from the first voltage level to the second voltage level different.

6. The circuit of claim 5, wherein the controller outputs a series of digital input pulses corresponding to the first digital input voltage until detecting a shift from the second voltage level to the first voltage level different.

7. The circuit of claim 1, wherein the latch circuit further comprises a first pair of cross-coupled switches and a second pair of cross-coupled switches.

8. The circuit of claim 7, further comprising:
a first load balancing circuit in signal communication with a first cross-coupled switch among the first pair of cross-coupled switches and a first cross-coupled switch among the second pair of cross-coupled switches; and
a second load balancing circuit in signal communication with a second cross-coupled switch among the first pair of cross-coupled switches and a second cross-coupled switch among the second pair of cross-coupled switches.

9. The circuit of claim 7, wherein the first pair of cross-coupled switches and the second pair of cross-coupled switches are configured to operate together as a back-to-back inverter memory cell.

10. The circuit of claim 9, wherein the first clocked differential switch is sized larger than the first pair of cross-coupled switches, wherein the second differential switch is sized larger than the second pair of cross-coupled switches in order to pull-down a respective side of the latch circuit to set the value of the back-to-back inverter memory cell.

11. A method of controlling a wide supply range digital level shifter circuit configured to shift between a variable desired output voltage ranging from a first voltage level set by a first voltage rail and a second voltage level set by a second voltage rail, the method comprising:
connecting a latch circuit between the first voltage rail and the second voltage rail, the latch circuit including first and second clocked differential switches, a first pair of cross-coupled switches, and a second pair of cross-coupled switches;
connecting a first bleeder circuit between the second voltage rail and the first clocked differential switch; and
connecting a second bleeder circuit between the second voltage rail and the second differential switch; and
isolating the first and second digital input voltages from the variable desired output voltage via the first and second bleeder circuits.

12. The method of claim 11, further comprising:
connecting a first energy storage device between the first bleeder circuit and a first input configured to receive a first digital input voltage; and
connecting a second energy storage device between the second bleeder circuit and a second input configured to receive a second digital input voltage.

13. The method of claim 11, further comprising controlling, via an electronic controller, a voltage state of the first and second digital input voltages based on a current voltage state of the variable desired output voltage.

14. The method of claim 13, further comprising:
outputting, via the controller, the second digital input voltage as a digital input pulse in response to determining the variable desired output voltage is a first voltage level; and
outputting, via the controller, the first digital input voltage as a digital input pulse in response to determining the variable desired output voltage is a second voltage level different from the first voltage level.

15. The method of claim 14, further comprising continuously refreshing a state of the latch circuit prior to shifting the voltage level of the variable desired output voltage.

16. The method of claim 15, wherein continuously refreshing the state of the latch circuit comprises:
outputting, via the controller, a series of digital input pulses corresponding to the second digital input voltage until detecting the shift from the first voltage level to the second voltage level different; and
outputting, via the controller, a series of digital input pulses corresponding to the first digital input voltage until detecting a shift from the second voltage level to the first voltage level different.

17. The method of claim 11, further comprising operating the first pair of cross-coupled switches and the second pair of cross-coupled switches as a back-to-back inverter memory cell.

18. The method of claim 17, further comprising sizing the first clocked differential switch larger than the first pair of cross-coupled switches, and sizing the second differential switch larger than the second pair of cross-coupled switches so as to pull-down a respective side of the latch circuit to set the value of the back-to-back inverter memory cell.

19. A wide supply range digital level shifter circuit configured to shift between a variable desired output voltage ranging from a first voltage level set by a first voltage rail and a second voltage level set by a second voltage rail, the wide supply range digital level shifter circuit comprising:
a latch circuit connected between the first voltage rail and the second voltage rail, the latch circuit including first and second clocked differential switches and a back-to-back inverter memory cell;
a first bleeder circuit connected between the second voltage rail and the first clocked differential switch and configured to receive a first digital input voltage; and
a second bleeder circuit connected between the second voltage rail and the second differential switch and configured to receive a second digital input voltage,
wherein the first and second bleeder circuits isolate the first and second digital input voltages from the variable desired output voltage, and the back-to-back inverter memory cell enables temporary storage of the variable desired output voltage.

* * * * *